(12) United States Patent
Liu et al.

(10) Patent No.: US 9,966,271 B2
(45) Date of Patent: May 8, 2018

(54) METHOD FOR MODIFYING EPITAXIAL GROWTH SHAPE

(71) Applicant: Applied Materials, Inc., Santa Clara, CA (US)

(72) Inventors: Wei Liu, San Jose, CA (US); Hua Chung, San Jose, CA (US); Xuebin Li, Sunnyvale, CA (US); Yuxiang Lu, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days. days.

(21) Appl. No.: 15/345,549

(22) Filed: Nov. 8, 2016

(65) Prior Publication Data
US 2017/0148636 A1    May 25, 2017

Related U.S. Application Data

(60) Provisional application No. 62/259,858, filed on Nov. 25, 2015.

(51) Int. Cl.
*H01L 21/302* (2006.01)
*H01L 21/3065* (2006.01)
(Continued)

(52) U.S. Cl.
CPC .... *H01L 21/3065* (2013.01); *H01J 37/32009* (2013.01); *H01J 37/3244* (2013.01);
(Continued)

(58) Field of Classification Search
CPC ........... H01J 2237/334; H01J 37/32009; H01J 37/3244; H01L 21/3065; H01L 21/3081;
(Continued)

(56) References Cited

U.S. PATENT DOCUMENTS 9,530,661 B2    12/2016  Kim et al.
9,653,461 B2 *   5/2017  Huang .............. H01L 29/66545
(Continued)

FOREIGN PATENT DOCUMENTS

KR    10-2013-0103271 A    9/2013

OTHER PUBLICATIONS

PCT Notification of Transmittal of the International Search Report and the Written Opinion of the International Searching Authority for International Application No. PCT/US2016/059761; dated Jan. 31, 2017; 10 total pages.

*Primary Examiner* — Lan Vinh
(74) *Attorney, Agent, or Firm* — Patterson + Sheridan LLP

(57) ABSTRACT

Methods for forming semiconductor devices, such as Fin-FET devices, are provided. An epitaxial film is formed over a semiconductor fin, and the epitaxial film includes a top surface having two facets and a bottom surface including two facets. A cap layer is deposited on the top surface, and portions of the epitaxial film in a lateral direction are removed by an isotropic plasma etch process. The isotropic plasma etch process may be performed at a pressure ranging from about 5 mTorr to about 200 mTorr in order to maximize the amount of radicals while minimizing the amount of ions in the plasma. Having a smaller lateral dimension prevents the epitaxial film from merging with an adjacent epitaxial film and creates a gap between the epitaxial film and the adjacent epitaxial film.

20 Claims, 6 Drawing Sheets

(51) Int. Cl.
  *H01J 37/32* (2006.01)
  *H01L 21/308* (2006.01)
  *H01L 29/66* (2006.01)
  *H01L 21/02* (2006.01)

(52) U.S. Cl.
  CPC ...... H01L 21/3081 (2013.01); H01L 21/3083 (2013.01); H01L 21/30655 (2013.01); H01L 29/66795 (2013.01); *H01J 2237/334* (2013.01); *H01L 21/02115* (2013.01); *H01L 21/02236* (2013.01); *H01L 21/02252* (2013.01); *H01L 21/02274* (2013.01)

(58) Field of Classification Search
  CPC ........... H01L 21/31144; H01L 21/3083; H01L 29/66795; H01L 21/30655; H01L 21/31133
  USPC ....... 438/706, 710, 712, 714, 717, 719, 723, 438/725, 736, 766, 694
  See application file for complete search history.

(56) References Cited

U.S. PATENT DOCUMENTS

| | | |
|---|---|---|
| 2007/0267703 A1 | 11/2007 | Chong et al. |
| 2011/0024388 A1* | 2/2011 | Suwa ................. G11B 5/855 216/22 |
| 2012/0067894 A1 | 3/2012 | Graells Ferrandez et al. |
| 2012/0299154 A1* | 11/2012 | Sim .................. H01L 21/28185 257/607 |
| 2013/0068390 A1* | 3/2013 | Sanchez ................ C30B 25/08 156/345.27 |
| 2015/0069531 A1 | 3/2015 | Naczas et al. |
| 2015/0303118 A1 | 10/2015 | Wang et al. |
| 2016/0111543 A1* | 4/2016 | Fang .................. H01L 29/7851 438/592 |
| 2016/0203995 A1* | 7/2016 | Kanarik .............. H01L 21/0228 438/703 |
| 2017/0005196 A1* | 1/2017 | Chen .................. H01L 29/7848 |
| 2017/0098547 A1 | 4/2017 | Kim et al. |

* cited by examiner

METHOD FOR MODIFYING EPITAXIAL GROWTH SHAPE

CROSS-REFERENCE TO RELATED APPLICATIONS

This application claims priority to U.S. Provisional Patent Application Ser. No. 62/259,858, filed on Nov. 25, 2015, which herein is incorporated by reference.

BACKGROUND

Field

Embodiments described herein generally relate to methods for forming semiconductor devices, and more particularly to methods for forming fin field effector transistors (FinFETs).

Description of the Related Art

As circuit densities increase for next generation devices, the widths of interconnects, such as vias, trenches, contacts, gate structures and other features, as well as the dielectric materials therebetween, decrease to 22 nm or smaller dimensions, whereas the thickness of the dielectric layers remain substantially constant, with the result of increasing the aspect ratios of the features. Recently, complementary metal oxide semiconductor (CMOS) FinFET devices have been widely used in many logic and other applications and are integrated into various different types of semiconductor devices.

FinFET devices typically include semiconductor fins with high aspect ratios in which the channel and source/drain regions for the transistor are formed thereover. A gate electrode is then formed over and along side of a portion of the FinFET devices utilizing the advantage of the increased surface area of the channel and source/drain regions to produce faster, more reliable and better-controlled semiconductor transistor devices. Further advantages of the FinFET devices include reducing the short channel effect and providing higher current flow.

To improve transistor performance, stressor materials may fill source/drain areas, and the stressor materials may grow in source/drain areas by epitaxy. The epitaxial film is faceted by {111} planes and has a diamond shape along the transistor channel direction. In other words, the epitaxial film may extend laterally and form facets. With the scaling down of transistors, fin pitch (distance between adjacent fins) is getting smaller. This may cause the reduction in the distance between an epitaxial film grown on a fin and an epitaxial film grown on an adjacent fin, which may cause adjacent epitaxial films to merge. The merged epitaxial films decreases the effect of epitaxial films on the strain in the transistor channel, and defects may form easily at the junction of the merged area.

Therefore, there is a need for an improved method for forming FinFETs.

SUMMARY

Methods for forming semiconductor devices, such as FinFET devices, are provided. In one embodiment, a method for forming a semiconductor device includes forming an epitaxial film over a semiconductor structure, and the epitaxial film includes a first surface having one or more facets and a second surface. The method further includes forming a first oxide layer on the first surface, and performing an isotropic plasma etch process on the epitaxial film to remove portions of the epitaxial film from the second surface. The isotropic plasma etch process is performed at a pressure ranging from about 5 mTorr to about 200 mTorr.

In another embodiment, a method for forming a semiconductor device includes forming an epitaxial film over a semiconductor fin, and the epitaxial film includes a first surface having a first facet and a second facet. The method further includes forming a mask layer on the first surface, the mask layer includes carbon, and performing an isotropic plasma etch process on the epitaxial film to remove portions of the epitaxial film in a lateral direction. The isotropic plasma etch process is performed at a pressure ranging from about 5 mTorr to about 200 mTorr.

In another embodiment, a processing tool includes a factory interface, a loadlock chamber, a transfer chamber, and a plurality of process chambers. The plurality of process chambers includes an epitaxial deposition chamber and an isotropic plasma etch chamber.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Methods for forming semiconductor devices, such as FinFET devices, are provided. An epitaxial film is formed over a semiconductor fin, and the epitaxial film includes a top surface having two facets and a bottom surface including two facets. A cap layer is deposited on the top surface, and portions of the epitaxial film in a lateral direction are removed by an isotropic plasma etch process. The isotropic plasma etch process may be performed at a pressure ranging from about 5 mTorr to about 200 mTorr in order to maximize the amount of radicals while minimizing the amount of ions in the plasma. Having a smaller lateral dimension prevents the epitaxial film from merging with an adjacent epitaxial film and creates a gap between the epitaxial film and the adjacent epitaxial film.

Figure 1A:
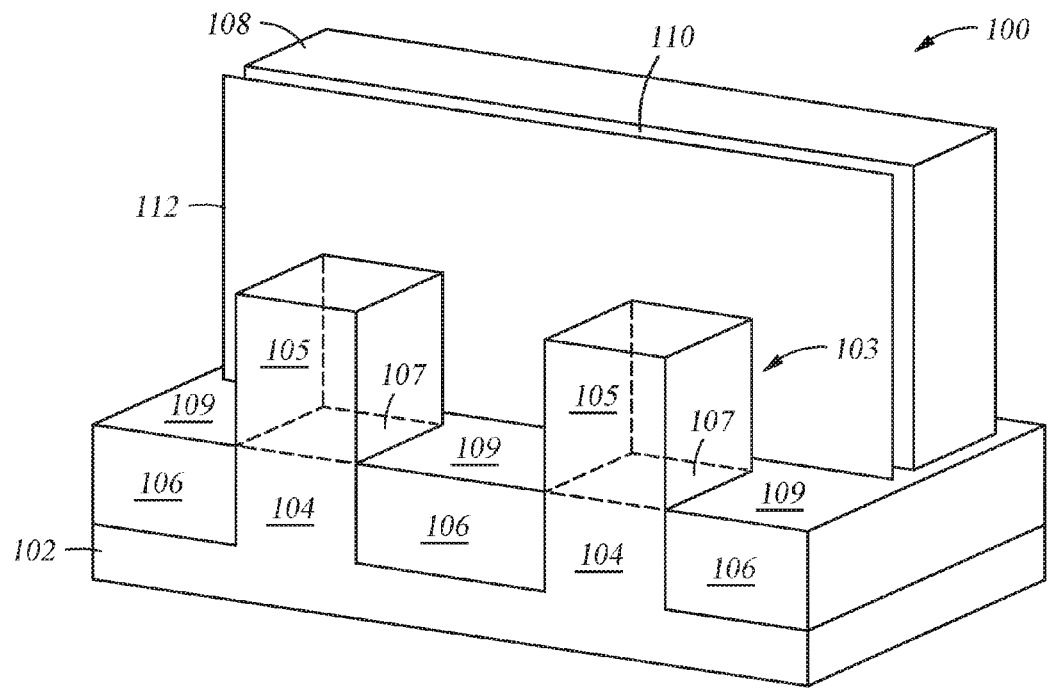
FIG. 1A is a perspective view of a semiconductor structure according to one embodiment described herein.

FIG. 1A is a perspective view of a semiconductor structure 100 according to one embodiment described herein. The semiconductor structure 100 may include a substrate 102, a plurality of semiconductor structures, such as semiconductor fins 103 (only two are shown), a dielectric material 106 disposed between the semiconductor fins 103 on the substrate 102, and a gate electrode 108 disposed on the dielectric material 106. The substrate 102 may be a bulk silicon substrate, and may be doped with a p-type or an n-type impurity. Other substrate materials include, but are not limited to, germanium, silicon-germanium, and group III/V compound semiconductors, such as GaAs, InGaAs, and other similar materials. The semiconductor fins 103 may include the same material as the substrate 102. The dielectric material 106 may form isolation regions, such as shallow trench isolation (STI) regions, and may include SiO, SiN, SiCN, or any suitable dielectric material. A gate spacer 112 may be formed on each side 110 of the gate electrode 108.

Figure 1B:
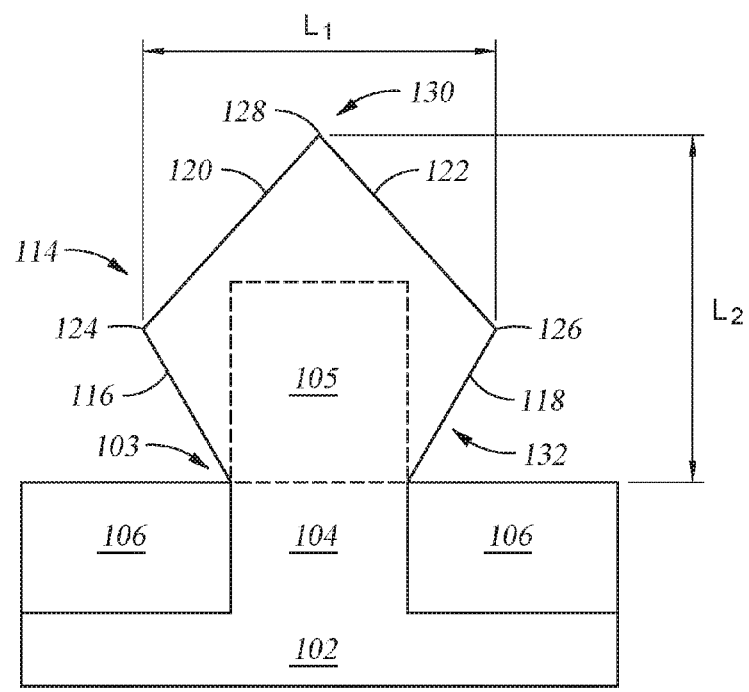
FIG. 1B is a schematic side view of a semiconductor fin and an epitaxial film formed on the semiconductor fin according to one embodiment described herein.

Each semiconductor fin 103 may include a first portion 104 which has a surface 107 that is coplanar with a surface 109 of the dielectric material 106, and a second portion 105 that protrudes from the first portion 104. The second portion 105 may be a source or drain region. To improve transistor performance, a stressor material may be grown in the source/drain region. FIG. 1B shows an epitaxial film 114 formed over each semiconductor fin 103. The epitaxial film 114 may enclose the second portion 105 of the semiconductor fin 103. Alternatively, the second portion 105 of the semiconductor fin 103 is removed and the epitaxial film 114 is formed on the first portion 104 of the semiconductor fin 103. The removal of the second portion 105 may be achieved by etching, polishing or other suitable removal process. The epitaxial film 114 may include SiGe, SiGe:B, Si:P, Ge:P, or other suitable semiconductor material. The epitaxial film 114 may be formed using a selective deposition process, such that the epitaxial film 114 is grown on the semiconductor fins 103 and not on the dielectric material 106. The selective deposition process may be achieved by co-flowing an etchant along with the precursor gases into the deposition chamber. Examples of the etchant may be HCl, $Cl_2$, or any suitable halogen gas. Precursor gases may include any suitable silicon containing gas, such as silane, disilane, an organosilane, or a halosilane, phosphorous containing gas such as phosphine, boron containing gas such a borane or diborane, and/or germanium containing gas such a germane.

The epitaxial film 114 may be grown epitaxially on the semiconductor fin 103, and because of the different growth rate on different surface planes, facets may be formed to cause the epitaxial film 114 to have a diamond shape. The epitaxial film 114 may include a first surface 130 and a second surface 132. The first surface 130 may include one or more facets 120, 122, and the second surface 132 may include on or more facets 116, 118. In one embodiment, the epitaxial film 114 has a diamond shape and includes facets 116, 118, 120, 122. Facets 116, 118 may be in contact with the semiconductor fin 103. Facet 116 and facet 120 may be in contact with each other, and a corner 124 may be formed at the contacting point. Facet 118 and facet 122 may be in contact with each other, and a corner 126 may be formed at the contacting point. Facet 120 and facet 122 may be in contact with each other, and a corner 128 may be formed at the contacting point. A lateral distance "$L_1$" between the corner 124 and the corner 126 may be substantially the same as a distance "$L_2$" between the corner 128 and the first portion 104 of the semiconductor fin 103. When a plurality of the epitaxial films 114 are formed adjacent to one another, the corners 124, 126 of one epitaxial film 114 may be merged with the corners 124, 126 of an adjacent epitaxial film 114. In order to improve transistor performance, portions of the epitaxial film 114 may be removed in the lateral dimension, i.e., reducing the lateral distance "$L_1$" without affecting the distance "$L_2$." As a result of a reduced lateral dimension, the distance between adjacent epitaxial films 114 is increased.

Figure 2A:
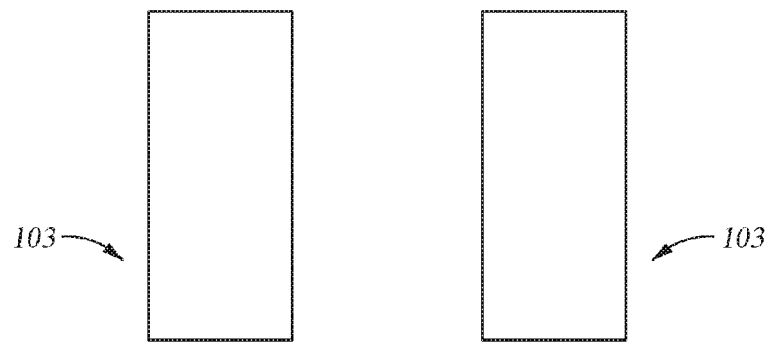
FIGS. 2A-2F illustrate a process for forming the semiconductor device according to one embodiment described herein.
Figure 2B:
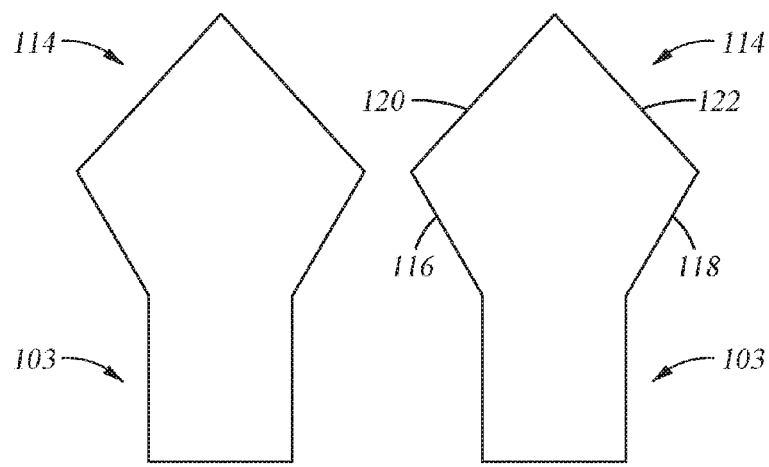
Figure 2C:
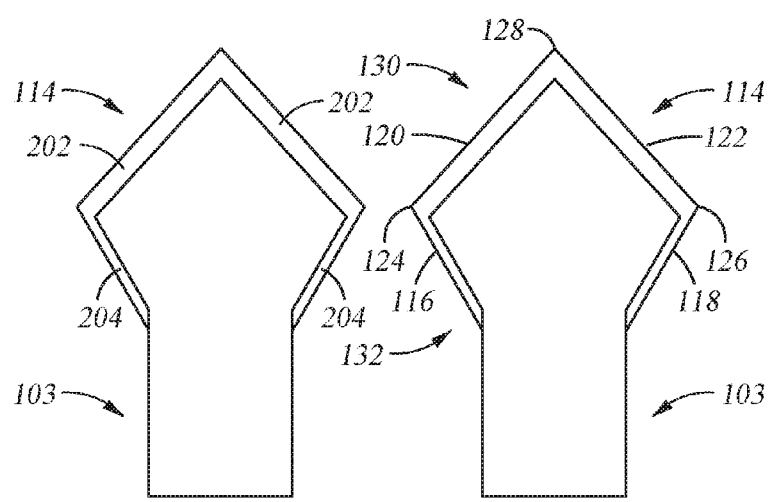

FIGS. 2A-2F illustrate the process steps of removing portions of the epitaxial film 114 according to one embodiment. FIG. 2A schematically illustrates two semiconductor fins 103 and the dielectric material 106 has been omitted for better illustration. The epitaxial film 114 may be epitaxially grown on each semiconductor fin 103, as shown in FIG. 2B. The epitaxial film 114 may be grown on the semiconductor fin 103 in an epitaxial deposition chamber. Next, an oxidation process may be performed on the epitaxial film 114 to form a first oxide layer 202 on the facets 120, 122 of the first surface 130 and to form a second oxide layer 204 on the facets 116, 118 of the second surface 132, as shown in FIG. 2C. The oxidation process may be a plasma oxidation process, such as a high energy plasma implantation process. An oxygen containing plasma, such as an $O_2$ plasma, may be formed in a plasma implantation chamber in which a substrate having epitaxial films 114 disposed thereon is disposed therein. The substrate may be disposed on a substrate support that is coupled to a DC bias energy source. During processing, high bias energy, such as between about 100 V to about 1,000 V, is applied to the plasma formed in the plasma implantation chamber. The high bias energy causes the oxygen ions and oxygen radicals in the plasma to have high energy, such as about 100 eV to about 1,000 eV. The high energy oxygen ions may be implanted into facets 120, 122 of the first surface 130 of the epitaxial film 114, forming a relatively thicker first oxide layer 202. The oxygen radicals may be implanted into facets 116, 118 of the second surface 132 of the epitaxial film 114, forming a relatively thinner second oxide layer 204. The ratio of the thicknesses of the first oxide layer 202 to the second oxide layer 204 is about 10:1. In some embodiments, the thickness of the first oxide layer 202 ranges from about 100 to about 200 Angstroms, and the thickness of the second oxide layer 204 ranges from about 10 to about 20 Angstroms. In one embodiment, the pressure inside the plasma implantation chamber may be relatively low, such as about 10 mTorr, during the plasma implantation process. An RF power used to form the oxygen plasma may be about 1000 W, and the processing gas flow rate, such as oxygen gas flow rate, may be about 100 standard cubic centimeters per minute (sccm).

Figure 2D:
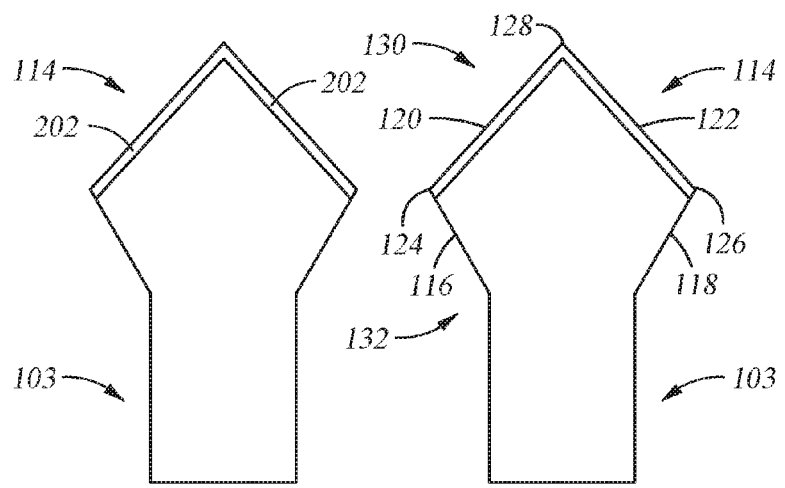

Next, the second oxide layer 204 may be removed, as shown in FIG. 2D. The removal process may include dipping the substrate having the epitaxial films 114 disposed thereon in a hydrogen fluoride (HF) solution. The HF solution may have 1 part HF and 100 parts water by weight. The HF solution may remove the entire second oxide layer 204 and a portion of the first oxide layer 202 since the first oxide layer 202 is much thicker than the second oxide layer 204. In one embodiment, the substrate having the epitaxial films 114 disposed thereon may be dipped in the HF solution for about 60 seconds.

Figure 2E:
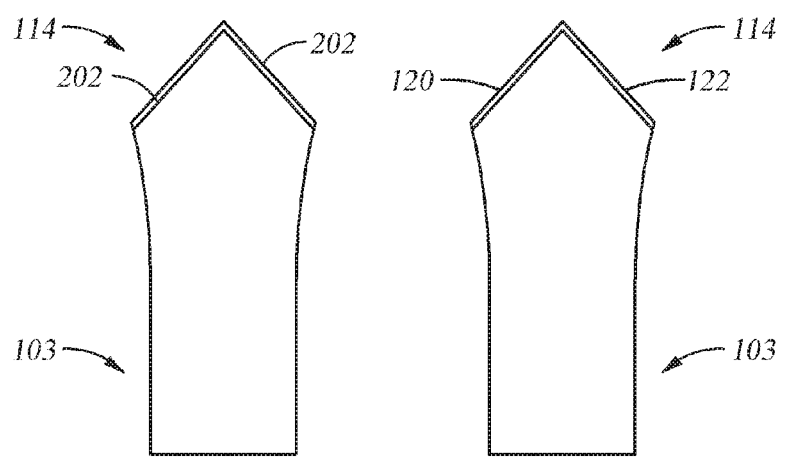

Next, as shown in FIG. 2E, an isotropic plasma etch may be performed on the epitaxial films 114 to remove at least a portion of the facets 116, 118 of the second surface 132. The isotropic plasma etch may also remove corners 124, 126, i.e., reducing the lateral distance $L_1$ without affecting the distance $L_2$. The isotropic plasma etch may be performed in a plasma etch chamber. Etchant used for the isotropic plasma etch may include $Cl_2$, $NF_3$, $O_2$, Ar, and combinations thereof. In one embodiment, $Cl_2$ is used.

The pressure in the plasma etch chamber during the isotropic plasma etch may be relatively high, such as between about 5 mTorr and about 200 mTorr. In one embodiment, the pressure is between about 20 mTorr and about 100 mTorr. The bias power applied to the plasma formed in the plasma etch chamber during process may be low, such as between 0 W and about 50 W. In one embodiment, the ions and radicals in the plasma have energy of less than about 10 eV. With the relatively high pressure and low bias power, the isotropic etch is performed by radicals instead of ions.

As a result of the isotropic etching, the corners 124, 126, a portion of the facets 120, 122, and at least a portion of the facets 116, 118 are removed. In one embodiment, both facets 116, 118 have been completed removed. A portion of the first oxide layer 202 may be removed by the isotropic plasma etch process. A portion of the dielectric material 106 (FIG. 1A) may be removed by the isotropic plasma etch process, but the reduced amount of the dielectric material 106 can be compensated by forming additional dielectric material 106 initially.

Figure 2F:
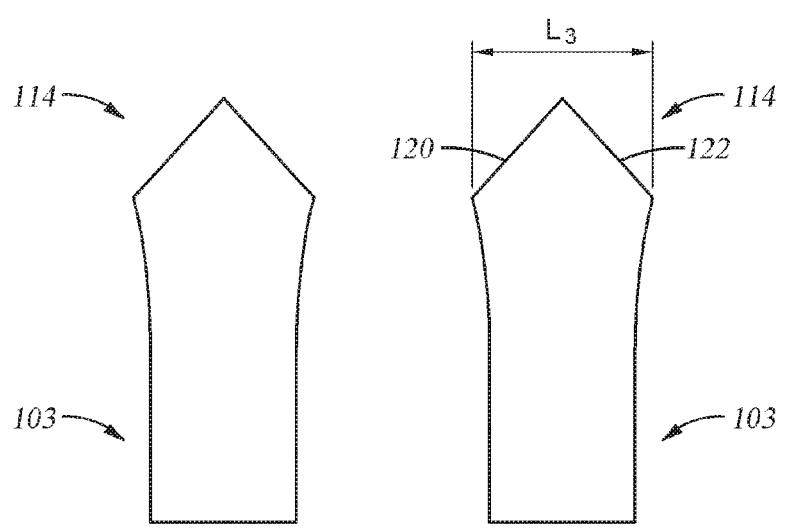

The remaining portion of the first oxide layer 202 may be removed, as shown in FIG. 2F. The removal process may be any suitable removal process. The resulting structure includes the epitaxial films 114 each having a reduced lateral distance $L_3$. The distance $L_2$ is not affected by the isotropic plasma etch process. As a result, the distance between adjacent epitaxial films 114 is increased. In some embodiments, processes shown in FIGS. 2B-2F may be repeated to increase the distance $L_2$ of the epitaxial films 114 while maintaining or reducing the lateral distance $L_1$. As a result of the process steps shown in FIGS. 2A-2F, a plurality of the epitaxial films 114 formed adjacent to one another would not be in contact with one another, which in turn improves transistor performance.

Figure 3A:
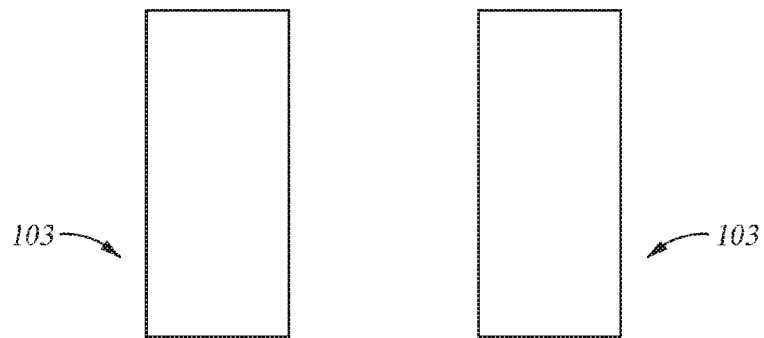
FIGS. 3A-3F illustrate a process for forming the semiconductor device according to another embodiment described herein.
Figure 3B:
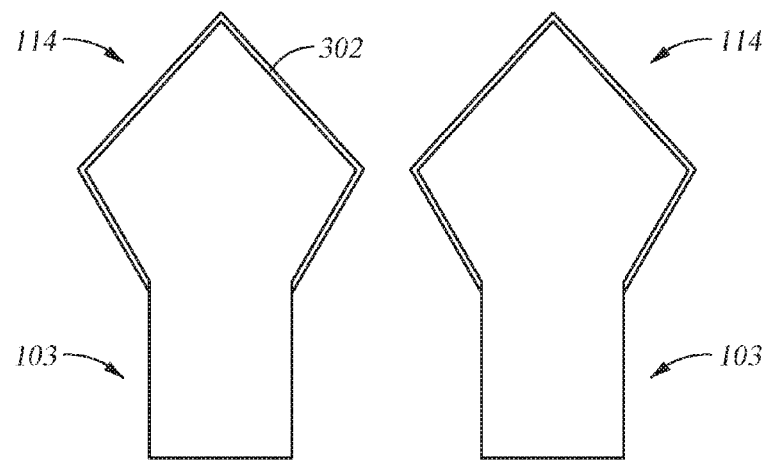
Figure 3C:
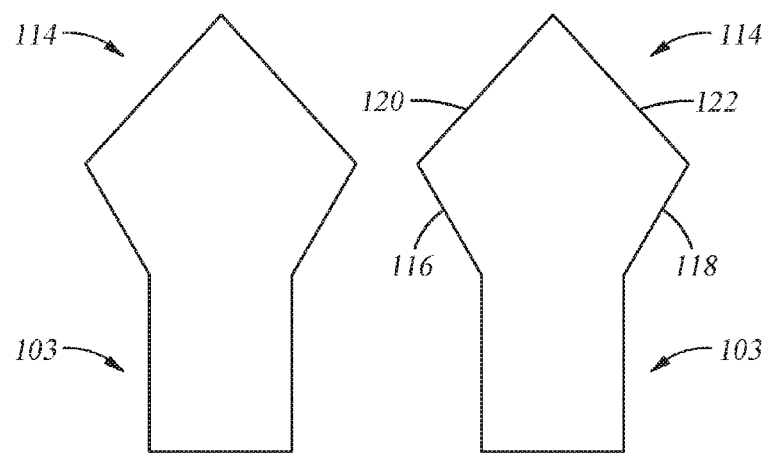

FIGS. 3A-3F illustrate the process steps of removing portions of the epitaxial film 114 according to another embodiment. FIG. 3A schematically illustrates two semiconductor fins 103 and the dielectric material 106 has been omitted for better illustration. The epitaxial film 114 may be epitaxially grown on each semiconductor fin 103, as shown in FIG. 3B. The epitaxial film 114 may be grown on the semiconductor fin 103 in an epitaxial deposition chamber. In one embodiment, a native oxide layer 302 may be formed on the epitaxial film 114, and an oxide removal process may be performed to remove the native oxide layer 302, as shown in FIG. 3C. In one embodiment, the removal process may include dipping the substrate having the epitaxial films 114 disposed thereon in a HF solution. The HF solution may have 1 part HF and 100 parts water by weight. In one embodiment, the substrate having the epitaxial films 114 disposed thereon may be dipped in the HF solution for about 60 seconds.

Figure 3D:
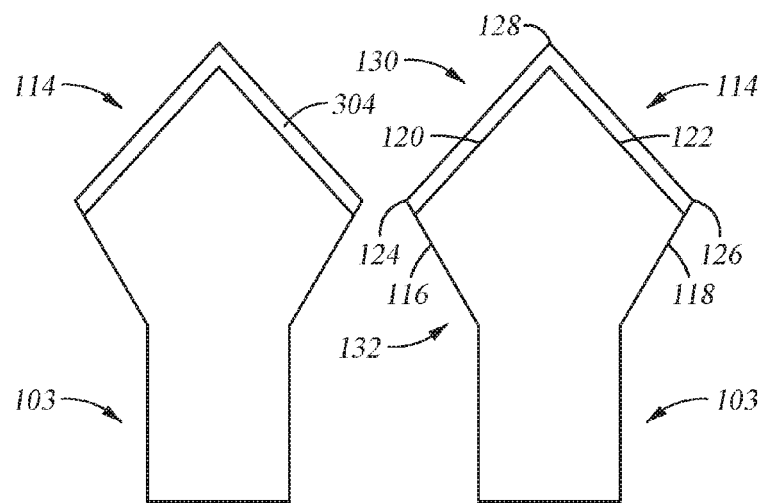

Next, a mask layer 304 may be formed on the facets 120, 122 of each epitaxial film 114, as shown in FIG. 3D. The mask layer 304 may be a hydrocarbon layer that is deposited using a carbon containing plasma, such as $CH_4$ plasma. In one embodiment, the mask layer 304 is diamond like carbon (DLC). The carbon containing plasma, such as $CH_4$ plasma, may be formed in a plasma chamber in which a substrate having epitaxial films 114 disposed thereon is disposed therein. During processing, a bias power of about 50 W may be applied to the plasma formed in the plasma chamber. In one embodiment, the pressure inside the plasma chamber may be about 60 mTorr during the plasma deposition process. An RF power used to form the carbon containing plasma may be about 800 W. Because of the relatively low bias power and high pressure, the mask layer 304 is formed on the first surface 130 and is not formed on facets 116, 118 of the second surface 132.

Figure 3E:
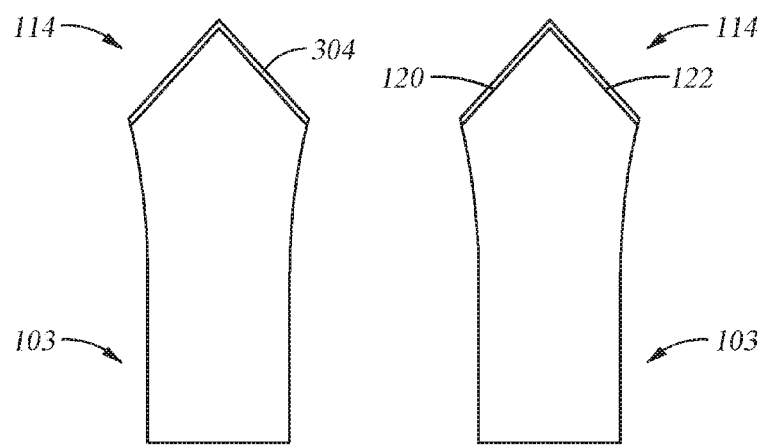

Next, as shown in FIG. 3E, an isotropic plasma etch may be performed on the epitaxial films 114 to remove at least a portion of the facets 116, 118 of the second surface 132. The isotropic plasma etch may also remove corners 124, 126, i.e., reducing the lateral distance $L_1$ without affecting the distance $L_2$. The isotropic plasma etch may be performed in a plasma chamber. In one embodiment, the isotropic plasma etch may be performed in the same plasma chamber in which the mask 304 is deposited. Etchant used for the isotropic plasma etch may include $Cl_2$, $NF_3$, $O_2$, Ar, and combinations thereof. In one embodiment, $Cl_2$ is used.

The pressure in the plasma etch chamber during the isotropic plasma etch may be relatively high, such as between about 5 mTorr and about 200 mTorr. In one embodiment, the pressure is between about 20 mTorr and about 100 mTorr. The bias power applied to the plasma formed in the plasma etch chamber during process may be low, such as between 0 W and about 50 W. In one embodiment, the ions and radicals in the plasma have energy of less than about 10 eV. With the relatively high pressure and low bias power, the isotropic etch is performed by radicals instead of ions. As a result of the isotropic etching, the corners 124, 126, a portion of the facets 120, 122, and at least a portion of the facets 116, 118 are removed. In one embodiment, both facets 116, 118 have been completed removed.

A portion of the mask layer 304 may be removed by the isotropic plasma etch process. Again a portion of the dielectric material 106 (FIG. 1A) may be removed by the isotropic plasma etch process, but the reduced amount of the dielectric material 106 can be compensated by forming additional dielectric material 106 initially.

Figure 3F:
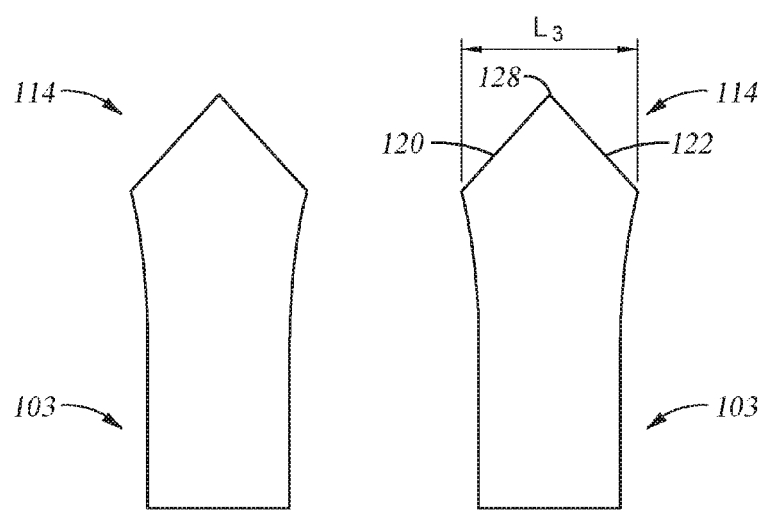

The remaining portion of the mask layer 304 may be removed, as shown in FIG. 3F. The removal process may be any suitable removal process. The resulting structure includes the epitaxial films 114 each having a reduced lateral distance $L_3$. The distance $L_2$ is not affected by the isotropic plasma etch process. As a result, the distance between adjacent epitaxial films 114 is increased. In some embodiments, processes shown in FIGS. 3B-3F may be repeated to increase the distance $L_2$ of the epitaxial films 114 while maintaining or reducing the lateral distance $L_1$. As a result of the process steps shown in FIGS. 3A-3F, a plurality of the epitaxial films 114 formed adjacent to one another would not be in contact with one another, which in turn improves transistor performance.

Figure 4:
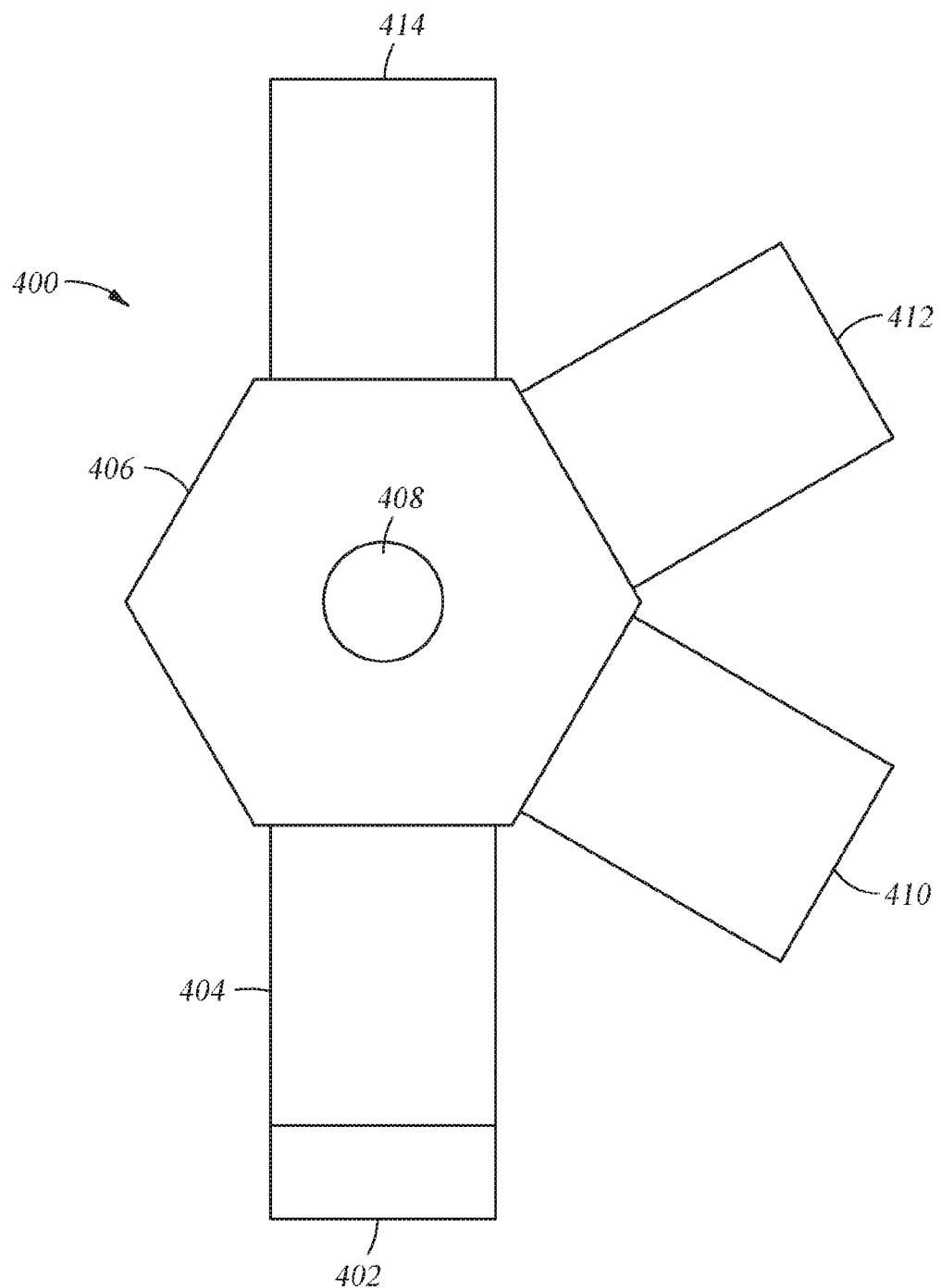
FIG. 4 illustrates a processing tool for performing the processes described in FIGS. 2A-2F and FIGS. 3A-3F according to embodiments described herein.

FIG. 4 illustrates a processing tool 400 for performing the processes described in FIGS. 2A-2F and FIGS. 3A-3F according to embodiments described herein. As shown in FIG. 4, the processing tool 400 may include a factory interface 402, a loadlock chamber 404 coupled to the factory interface 402, a transfer chamber 406 coupled to the loadlock chamber 404, and a plurality of process chambers 410, 412, 414 coupled to the transfer chamber 406. A robot 408 may be disposed in the transfer chamber 406 for transferring substrates from the loadlock chamber 404 to the process chambers 410, 412, 414, or vice versa. The process chamber 410 may be an epitaxial deposition chamber in which epitaxial films, such as epitaxial films 114, are formed. The process chamber 412 may be a plasma implantation chamber in which oxide layers, such as oxide layers 202, 204, are formed. The process chamber 414 may be a plasma etch chamber in which an isotropic plasma etch process may be performed.

In one embodiment, the process chamber 412 is a plasma deposition chamber in which a mask layer, such as the mask layer 304, is formed. In one embodiment, the process chamber 412 is omitted, and the process chamber 414 may be also used for depositing a mask layer, such as the mask layer 304, in addition to performing the plasma etch process.

While the foregoing is directed to embodiments of the disclosure, other and further embodiments may be devised without departing from the basic scope thereof, and the scope thereof is determined by the claims that follow.

The invention claimed is:

1. A method for forming a semiconductor device, comprising:
    forming an epitaxial film with a diamond shape over a semiconductor structure, wherein the epitaxial film includes a first surface having one or more facets and a second surface;
    forming a first oxide layer on the first surface; and
    performing an isotropic plasma etch process on the epitaxial film to remove portions of the epitaxial film from the second surface, wherein the isotropic plasma etch process is performed at a pressure ranging from about 5 mTorr to about 200 mTorr.

2. The method of claim 1, wherein the isotropic plasma etch process removes portions of the epitaxial film in a lateral direction.

3. The method of claim 1, wherein the first surface includes two facets and the second surface includes two facets, and wherein the epitaxial film has a diamond shape.

4. The method of claim 1, wherein the isotropic plasma etch process removes a portion of the first surface.

5. The method of claim 1, wherein the first oxide layer is formed by a plasma implantation process.

6. The method of claim 5, wherein the plasma implantation process is performed in a process chamber at a chamber pressure of about 10 mTorr.

7. The method of claim 1, further comprising forming a second oxide layer on the second surface prior to the isotropic plasma etch process.

8. The method of claim 7, wherein the first oxide layer has a first thickness and the second oxide layer has a second thickness smaller than the first thickness.

9. The method of claim 8, further comprising removing the second oxide layer using a dip process prior to the isotropic plasma etch process.

10. The method of claim 9, wherein the dip process comprises dipping the epitaxial film in a hydrogen fluoride solution.

11. The method of claim 10, wherein the hydrogen fluoride solution comprises one part hydrogen fluoride and 100 parts water by weight.

12. A method for forming a semiconductor device, comprising:
    forming an epitaxial film with a diamond shape over a semiconductor fin, wherein the epitaxial film includes a first surface having a first facet and a second facet;
    forming a mask layer on the first surface, wherein the mask layer comprises carbon; and
    performing an isotropic plasma etch process on the epitaxial film to remove portions of the epitaxial film in a lateral direction, wherein the isotropic plasma etch process is performed at a pressure ranging from about 5 mTorr to about 200 mTorr.

13. The method of claim 12, further comprising removing a native oxide layer from the epitaxial film prior to forming the mask layer.

14. The method of claim 12, wherein the mask layer is diamond like carbon.

15. The method of claim 12, wherein the isotropic plasma etch process removes a portion of the first surface.

16. The method of claim 12, wherein the epitaxial film further comprises a second surface.

17. The method of claim 16, wherein the isotropic plasma etch removes at least a portion of the second surface.

18. A method for forming a semiconductor device, comprising:
    forming an epitaxial film over a semiconductor structure, wherein the epitaxial film includes a first surface having one or more facets and a second surface;
    forming an oxide layer on the first surface; and
    performing an isotropic plasma etch process on the epitaxial film to remove portions of the epitaxial film from the second surface, wherein the isotropic plasma etch process is performed at a pressure ranging from about 5 mTorr to about 200 mTorr with radical energy of less than 10 eV.

19. The method of claim 18, wherein the isotropic plasma etch process is performed at the pressure ranging from about 20 mTorr to about 100 mTorr.

20. The method of claim 18, wherein the first surface includes two facets and the second surface includes two facets, and wherein the epitaxial film has a diamond shape.

* * * * *